United States Patent
Grant et al.

(10) Patent No.: US 8,039,339 B2
(45) Date of Patent: Oct. 18, 2011

(54) SEPARATE LAYER FORMATION IN A SEMICONDUCTOR DEVICE

(75) Inventors: John M. Grant, Austin, TX (US); Srikanth B. Samavedam, Austin, TX (US); Suresh Venkatesan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/738,683

(22) Filed: Apr. 23, 2007

(65) Prior Publication Data

US 2008/0261374 A1    Oct. 23, 2008

(51) Int. Cl.
*H01L 21/8238* (2006.01)
(52) U.S. Cl. ........ 438/221; 438/218; 438/424; 438/631; 438/637; 438/778
(58) Field of Classification Search .................. 438/207, 438/218, 221, 424, 631, 637, 761, 778, FOR. 187, 438/FOR. 395
See application file for complete search history.

(56) References Cited

U.S. PATENT DOCUMENTS

| | | | |
|---|---|---|---|
| 5,447,874 A * | 9/1995 | Grivna et al. | 438/174 |
| 6,013,551 A | 1/2000 | Chen et al. | |
| 6,027,961 A | 2/2000 | Maiti et al. | |
| 6,204,103 B1 | 3/2001 | Bai et al. | |
| 6,262,456 B1 | 7/2001 | Yu et al. | |
| 6,545,324 B2 | 4/2003 | Madhukar et al. | |
| 6,627,510 B1 | 9/2003 | Evans et al. | |
| 6,846,734 B2 | 1/2005 | Amos et al. | |
| 6,919,647 B2 * | 7/2005 | Hackler et al. | 257/250 |
| 7,018,887 B1 | 3/2006 | Pan | |
| 7,074,664 B1 | 7/2006 | White et al. | |
| 2004/0012022 A1 * | 1/2004 | Wu | 257/68 |
| 2006/0008968 A1 | 1/2006 | Brask et al. | |
| 2006/0046448 A1 | 3/2006 | Barns et al. | |

OTHER PUBLICATIONS

International Search Report and Written Opinion for correlating PCT Patent Application No. PCT/US2008/059352 dated Aug. 26, 2008.

* cited by examiner

*Primary Examiner* — N Drew Richards
*Assistant Examiner* — Joannie A Garcia
(74) *Attorney, Agent, or Firm* — David G. Dolezal; James L. Clingan, Jr.

(57) ABSTRACT

A semiconductor device is formed. A first gate dielectric layer is formed over the semiconductor layer. A first conductive layer is formed over the first gate dielectric. A first separation layer is formed over the first conductive layer. A trench is formed in the semiconductor layer to separate the first mesa and the second mesa. The trench is filled with an isolation material to a height above a top surface of the first conductive layer. The first conductive layer is removed from the second mesa. A second conductive layer is formed over the first separation layer of the first mesa and over the second mesa. A planarizing etch removes the second conductive layer from over the first mesa. A first transistor of a first type is formed in the first mesa, and a second transistor of a second type is formed in the second mesa.

25 Claims, 6 Drawing Sheets

SEPARATE LAYER FORMATION IN A SEMICONDUCTOR DEVICE

BACKGROUND OF THE INVENTION

1. Field of the Invention

This invention relates in general to semiconductor devices and more specifically to the formation of semiconductor devices with separately formed layers.

2. Description of the Related Art

In some integrated circuits, it is desirable to form corresponding layers of different devices at different times and/or of different materials. One example is in the formation of the gates of P-channel type and N-channel type transistors of an integrated circuit. It may be desirable to have the gate of the P-channel type transistor be of one material and the gate of the N-channel type transistor to be of a second material to provide each transistor with a different threshold voltage.

However, there are challenges in forming such structures with conventional methods. What is desired is an improved technique for forming an integrated circuit with corresponding structures of different materials.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

FIGS. 1-12 are cutaway side views of various stages of a wafer used in forming an integrated circuit having transistors with gates of different materials according to one embodiment of the present invention.

Figure 1:
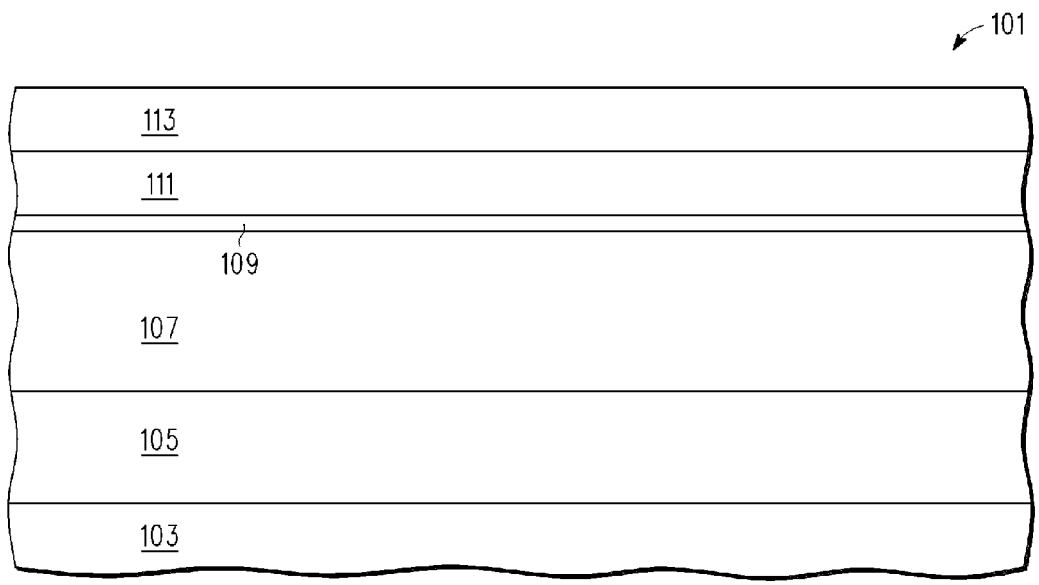
FIG. 1-12 are cutaway side views of various stages of a wafer during different stages in its manufacture according to one embodiment of the present invention.

FIG. 1 shows a cutaway side view of wafer 101. In the embodiment shown, wafer 101 has a semiconductor on insulator (SOI) configuration. In the embodiment shown, wafer 101 includes a substrate layer 103 (e.g. of silicon, silicon germanium), an insulator layer 105 (e.g. silicon dioxide) located on layer 103, a semiconductor layer 107 (e.g. mono crystalline silicon) located on insulator layer 105, and a gate dielectric layer 109 located on layer 107. In one embodiment, gate dielectric layer 109 is grown by an oxidation process from layer 107. In other embodiments, dielectric layer 109 may be a deposited layer of a dielectric material (e.g. a high K dielectric material such as hafnium oxide or other metal oxide). Wafer 101 includes a conductive gate electrode layer 111 located on gate dielectric layer 109. In one embodiment, layer 111 is of a conductive metal material (e.g. tantalum carbide, titanium carbide, tantalum magnesium carbide, titanium magnesium carbide, titanium lanthanum carbide, tantalum lanthanum carbide, titanium silicon nitride, tantalum silicon nitride, tantalum nitride, tantalum silicon nitride, titanium nitride, or molybdenum nitride. In one embodiment, layer 111 has a thickness in the range of 50-100 Angstroms, but may have other thicknesses in other embodiments. Layer 113 is located on layer 111. In one embodiment, layer 113 is subsequently utilized as a separation layer and a polish stop layer. In one embodiment, layer 113 has a thickness in the range of 100-150 Angstroms and is made of a nitride, but may be of other thickness and/or made of other materials in other embodiments.

In one embodiment, semiconductor layer 107 may include well dopants for transistors formed subsequently on wafer 101. In one embodiment, one portion of layer 107 would be doped with an N-type dopant (phosphorous, arsenic, antimony) and the other portion would be doped with a P-type dopant (boron, indium).

Figure 2:
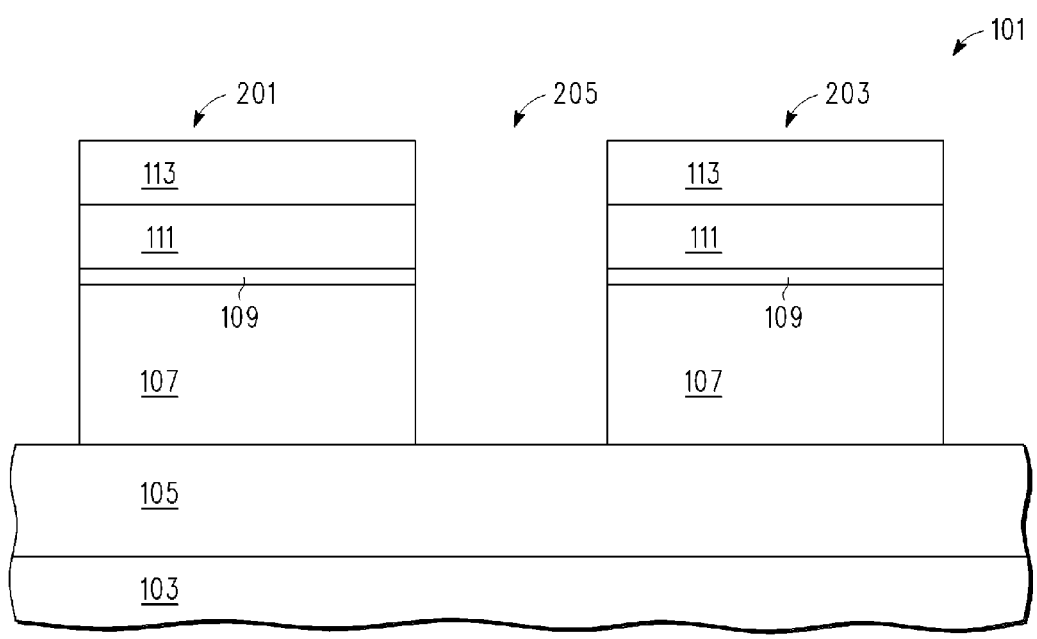

FIG. 2 is a cutaway side view of wafer 101 after mesas 201 and 203 are formed in wafer 101. In one embodiment, mesas 201 and 201 are formed by forming a patterned mask e.g. photo resist (not shown) over wafer 101 and removing the material of layers 113, 111, 109, and 107 outside the mask to form a trench 205. In one embodiment, the materials of those layers are removed by etching the materials with etch chemistries appropriate for removing those materials. Afterwards, the mask is removed.

Figure 3:
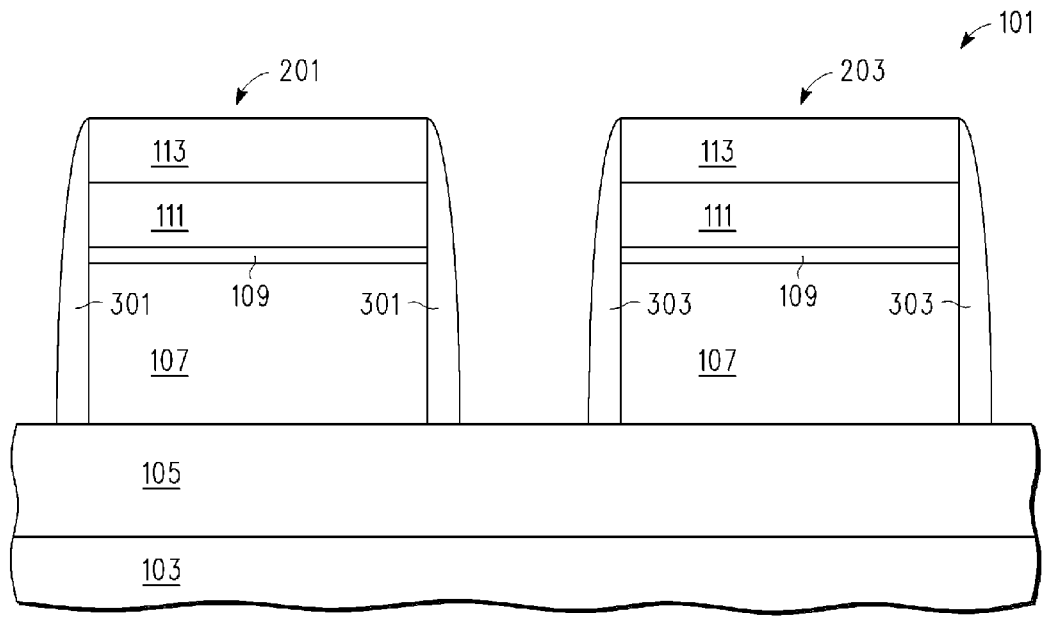

FIG. 3 shows a cutaway side view of wafer 101 after spacers 301 and 303 are formed on the side walls of mesas 201 and 203 respectively. In one embodiment, spacers 301 and 303 are made of silicon nitride. In one embodiment, spacers 301 and 303 are formed by depositing a conformal layer of material over wafer 101 and then anisotropically etching the layer. In one embodiment, the layer for forming spacers 301 and 303 has thickness in the range 200-300 Angstroms, but may have other thicknesses and/or be made of other materials in other embodiments. Spacers 301 and 303 cover the sidewall of at least layer 111 and protect layer 111 during subsequent processes.

Figure 4:
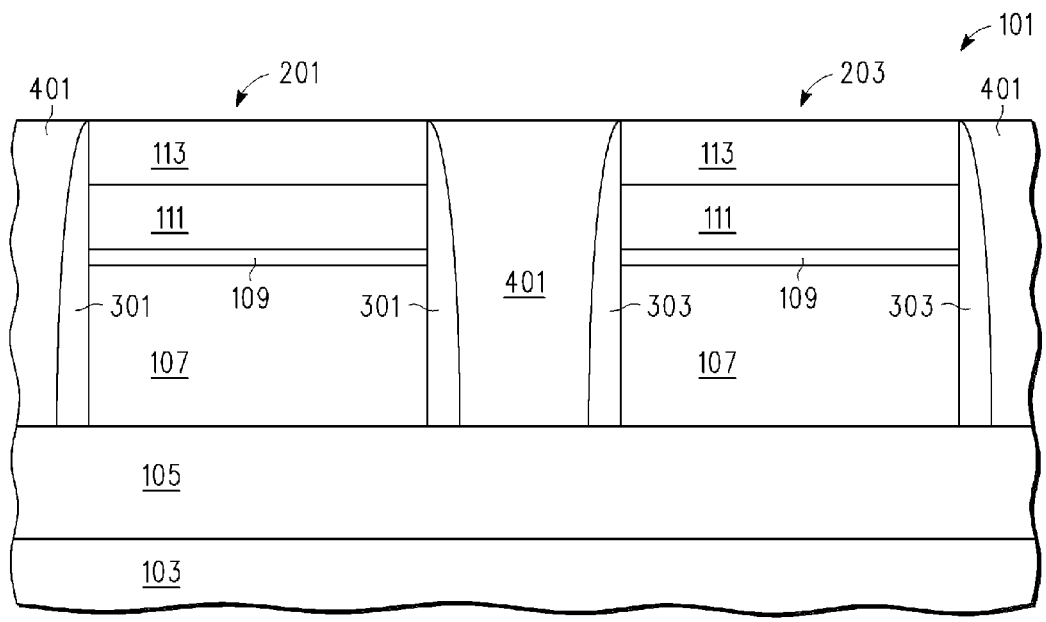

FIG. 4 is cutaway side view of wafer 101 after isolation material 401 is formed in the trenches 205 surrounding mesas 201 and 203. In one embodiment, the isolation material 401 is made of a dielectric material (e.g. silicon dioxide). In one embodiment, the dielectric material is conformally formed over wafer 101 at a thickness sufficient to fill the trenches. Wafer 101 is then planarized (e.g. with a chemical mechanical polishing (CMP) process) to remove the trench fill material over the mesas. Layer 113 is used as a polish stop for the chemical mechanical polish.

Figure 5:
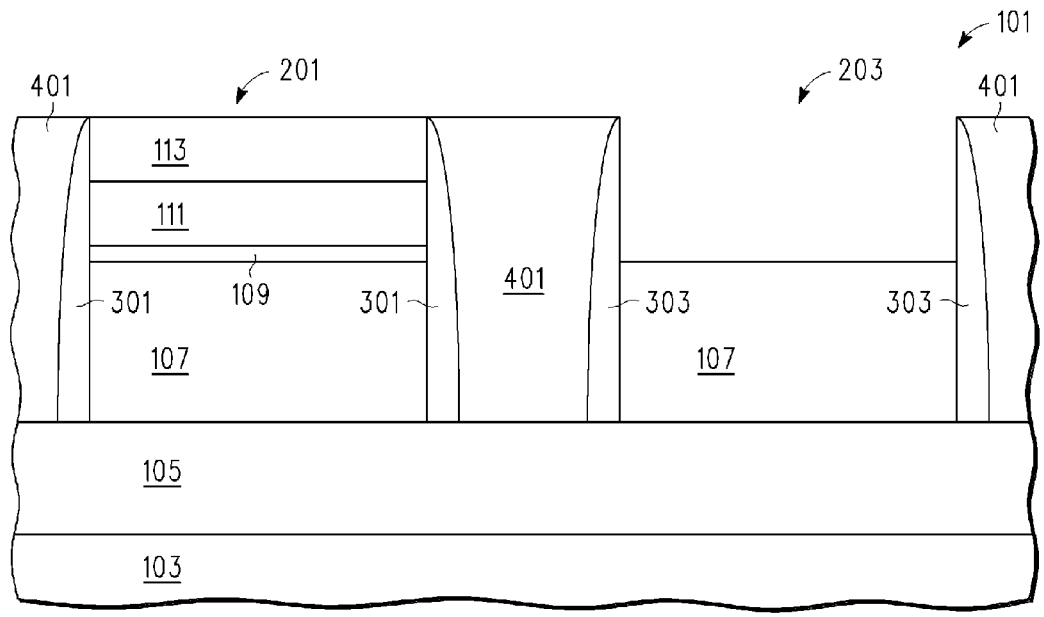

FIG. 5 shows a side view of wafer 101 after the material of layer 113, gate electrode layer 111, and dielectric layer 109 are removed from mesa 203. In one embodiment, this material is removed by selectively forming a mask (not shown) e.g. of photo resist over mesa 201 and leaving mesa 203 exposed. The exposed layers of mesa 203 are then removed by subjecting those layers to appropriate etch chemistries for their removal. For example, if layer 113 is silicon nitride, then an etch chemistry of hot phosphoric acid or a dry etch of a fluorine containing gas may be used to remove that layer in mesa 203. In examples where layer 111 is tantalum carbide or titanium nitride, an etch chemistry of ammonium hydroxide, hydrogen peroxide, and water may be used. In one example, an anneal in an HCl gas atmosphere may be used to remove gate dielectric layer 109.

In the embodiment of FIG. 5, dielectric layer 109 of mesa 203 is removed. However, in other embodiments, dielectric layer 109 would not be removed. In some of these embodiments, dielectric layer 109 of mesa 203 would annealed in an oxygen containing atmosphere to repair the damage from the removal of layer 111. During this anneal, layer 111 of mesa 201 would be protected by layer 113 and spacer 301 from the oxidizing effects of the anneal.

Figure 6:
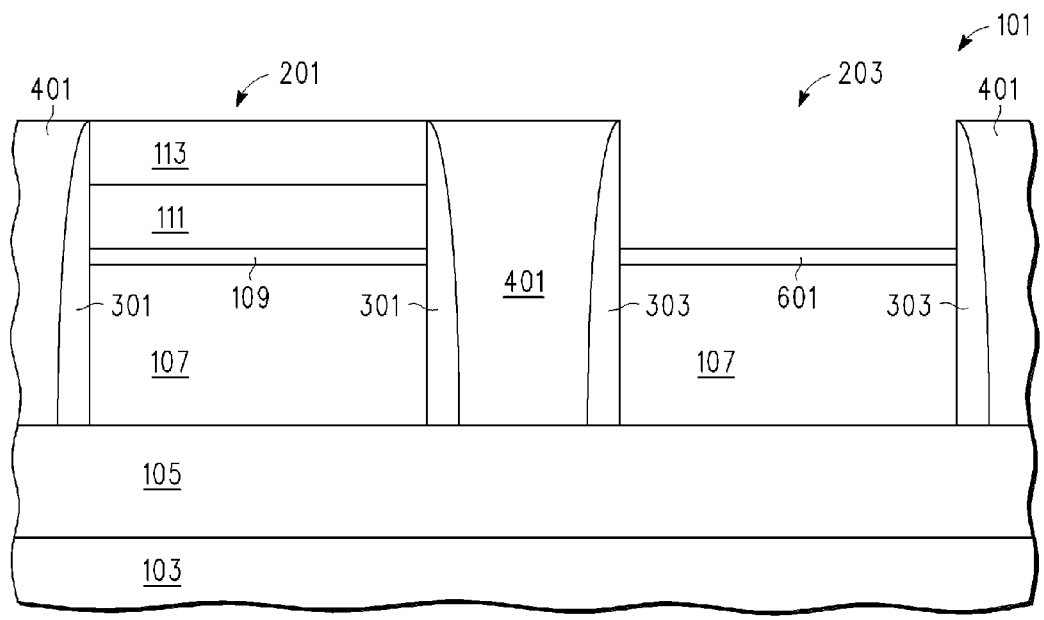

FIG. 6 shows a cutaway side view of wafer 101 after a layer 601 of silicon germanium is formed on layer 107 of mesa 203. In one embodiment, silicon germanium layer 601 has a thickness in the range of 25-100 Angstroms, but may be of other thicknesses in other embodiments. In one embodiment where layer 107 is silicon, layer 601 is epitaxially grown on layer 107. In one embodiment, the silicon germanium layer may contain boron doping incorporated during the silicon germanium layer growth. Silicon germanium layer 601 is utilized to modify the threshold voltage of a subsequently formed P-channel transistor in mesa 203.

One advantage of the processes described herein is that it may allow for the transistors of mesa 203 to have a separately formed semiconductor layer from the transistors of mesa 201, wherein the separately formed semiconductor layer is formed after the formation of gate electrode layer 111.

In some embodiments, prior to the formation of dielectric layer 109 and layer 111, a silicon germanium layer may be formed on layer 107 in the area where mesa 203 is to be formed and not in the area where mesa 201 is to be formed. Still in other embodiments, the active region of the P-channel transistor would not include a silicon germanium layer but instead would be completely formed from layer 107. Still in other embodiments, layer 601 may be made of other materials (e.g. carbon-doped silicon, germanium, gallium arsenide, doped silicon).

Figure 7:
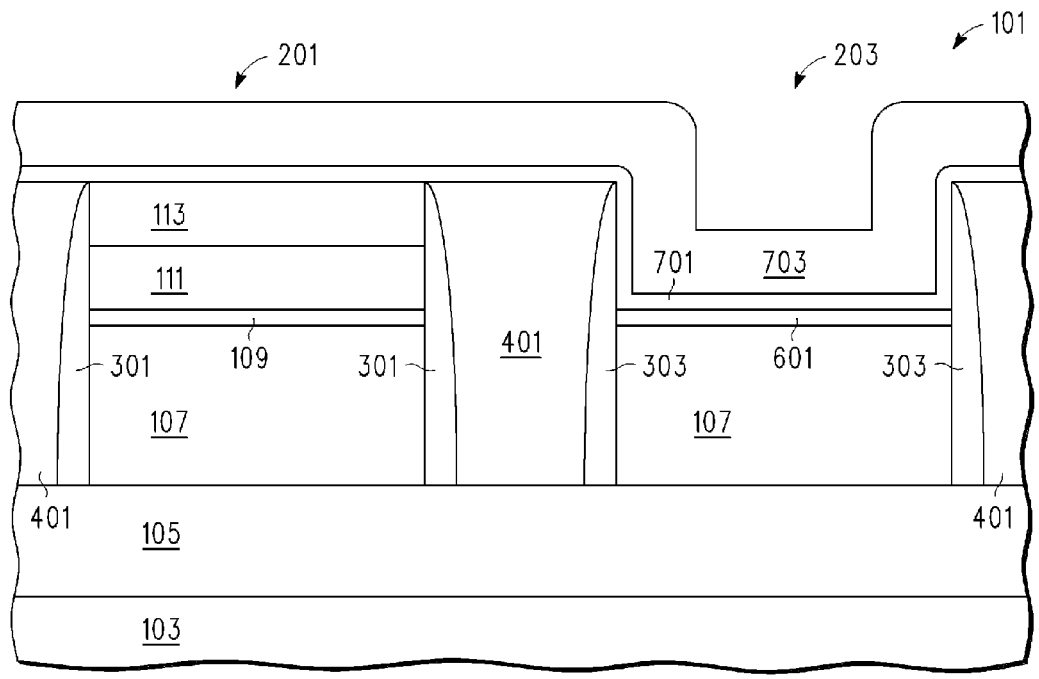

FIG. 7 shows a cutaway side view of wafer 101 after a gate dielectric layer 701 and a gate electrode layer 703 are formed over wafer 101. In one embodiment, gate dielectric layer 701 is made of hafnium oxide and has a thickness in the range of 10-60 Angstroms, but may be of other thicknesses and/or made of other gate dielectric materials in other embodiments. In one embodiment, dielectric layer 701 may be of a different material than dielectric layer 109. In some embodiments, where gate dielectric layer 109 is not removed from mesa 203, dielectric layer 701 (e.g. aluminum oxide, lanthanum oxide) would be formed on layer 109 in mesa 203. In the embodiment where the layer 109 is not removed, the thickness of layer 701 is in the range of 2-15 Angstroms. In other embodiments where layer 109 is not removed in mesa 203, gate dielectric layer 701 would not be formed.

Layer 703 is made of a material to provide an appropriate work function for a subsequently formed transistor in mesa 203. In embodiments where a P-channel transistor is to be formed, layer 703 may be made of e.g. molybdenum nitride or titanium nitride. Layer 703 is deposited by a chemical or physical vapor deposition or an atomic layer deposition process, but may be deposited by other methods in other embodiments.

In embodiments where an N-channel transistor is to be formed in mesa 201 and a P-channel transistor is to be formed in mesa 203, layer 111 and layer 703 may be made of different materials. For example, layer 111 may be made of tantalum carbide and layer 703 may be made of molybdenum nitride. In some embodiments, both layer 111 and layer 703 would be made of titanium nitride, but each layer would have a different concentration of nitrogen. Still in other embodiments, layers 111 and 703 may be made of the same material.

Figure 8:
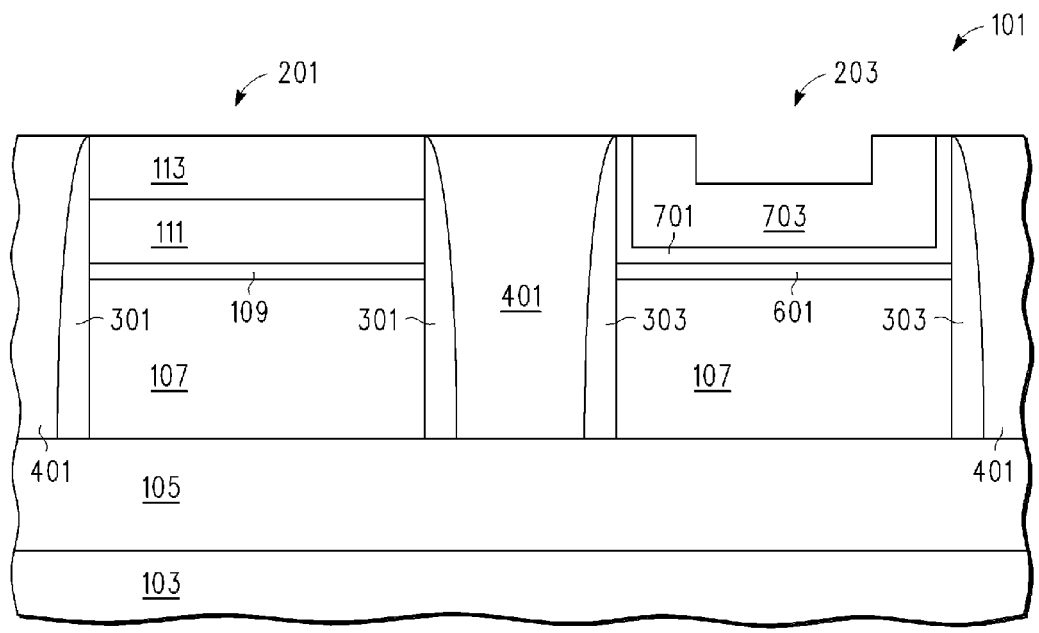

FIG. 8 shows a cutaway side view of wafer 101 after wafer 101 has been subject to a planarization (e.g. CMP) process to remove the material of layer 703 and the material of layer 701 over mesa 201. In the embodiment shown, layer 113 is used as a planarization stop. Utilizing a planarization process allows for the material of gate electrode layer 703 to be removed from over mesa 201 without the employing a mask for its removal.

Figure 9:
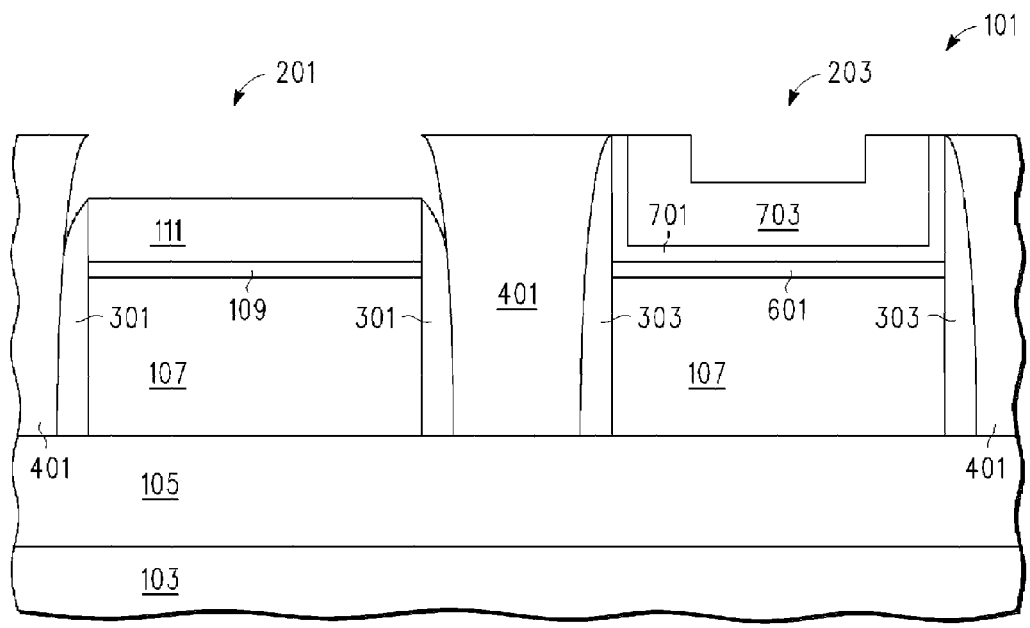

FIG. 9 shows a cut away side view of wafer 101 after the material of layer 113 has been removed from mesa 201. In one embodiment, the nitride of layer 113 is removed by subjecting wafer 101 to an etch where mesa 203 is covered by a mask (not shown).

Figure 10:
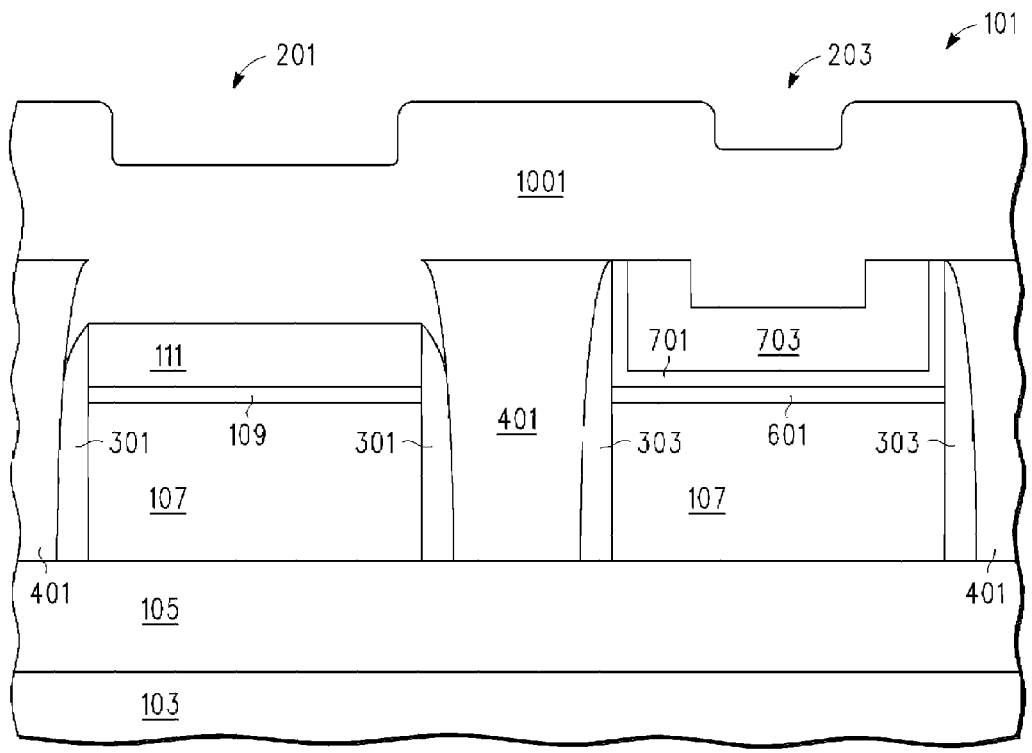

FIG. 10 shows a cutaway side view of wafer 101 after a conformal layer 1001 of interconnect material (e.g. doped poly silicon or other type of conductive material) is formed over wafer 101 including over mesas 201 and 203.

Figure 11:
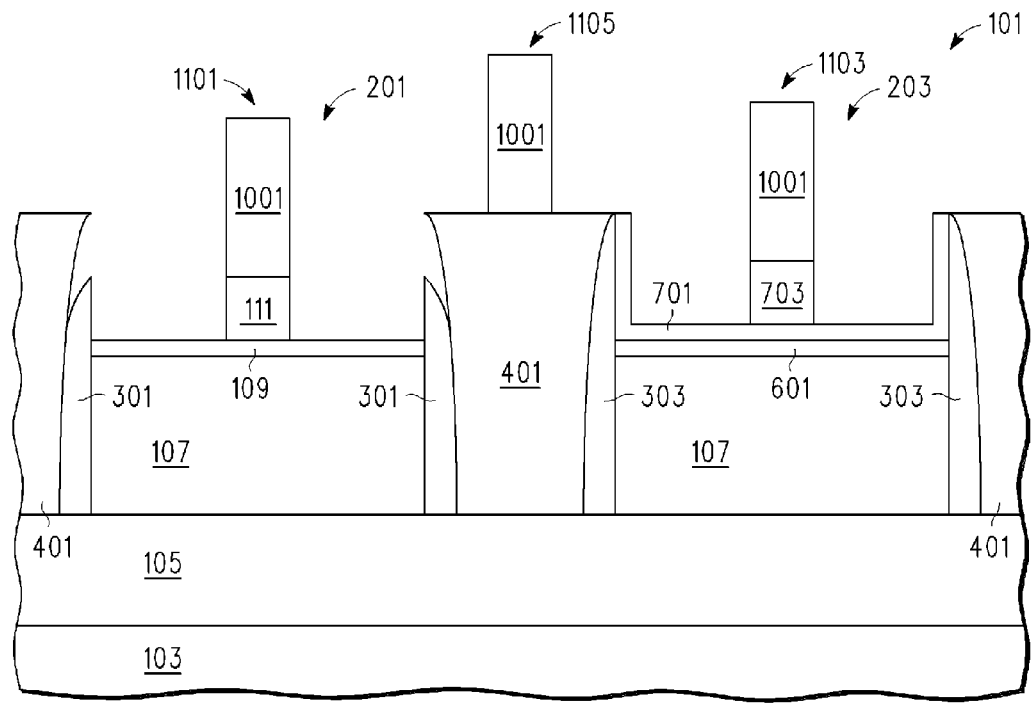

FIG. 11 shows a cutaway side view of wafer 101 after gate stacks 1101 and 1103 are formed. Gate stack 1101 is formed by patterning layer 1001 and layer 111 in mesa 201. Gate stack 1103 is formed by patterning layer 1001 and layer 703 in mesa 203. Also formed from layer 1001 is an interconnect structure 1105 on isolation material 401. In one embodiment, interconnect structure 1105 would electrically couple two gates.

In one embodiment, gate stacks 1101, 1103, and interconnect structure 1105 are formed by forming a mask (e.g. photo resist) over wafer 101 and etching layer 1001.

Also in one embodiment, layers 111 and 703 would be etched together with the same etch chemistry. For example, where layer 111 is made of tantalum carbide and layer 703 is made of molybdenum nitride, both layers could be etched with a chorine based or fluorine based plasma etch chemistry.

One advantage of that may occur with the processes described herein is that it may allow for the gate electrode layers 111 and 703 to be of different thicknesses to account for different etch rates of the different materials of those layers. For example, where layer 111 is made of tantalum carbide and layer 703 is made of molybdenum nitride, molybdenum nitride would etch faster with either the chlorine based or fluorine based plasma etch chemistry. Accordingly, layer 703 can be made thicker than layer 111 with the processes described herein to account for this difference in etch rates. Because layer 703 can be made thicker to account for the difference in etch rates, dielectric layer 701 (and possibly layer 601) would not be significantly etched with the etchant used to etch layers 111 and 703 in that layers 111 and 703 would be remove at approximately the same time.

In other embodiments, mesas 201 and 203 may be etched at different times to form gate stacks 1101 and 1103.

Figure 12:
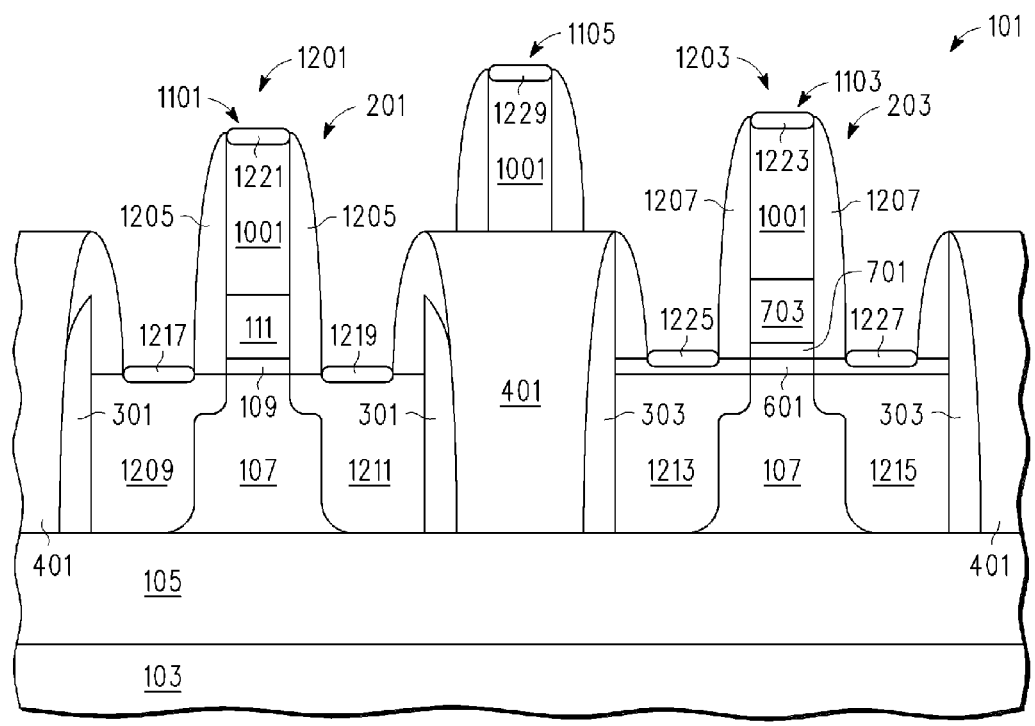

FIG. 12 shows a cutaway side view of wafer 101 after source/drain region (current terminal regions for a MOSFET) are formed. Source/drain regions 1209 and 1211 are formed in mesa 201 and source/drain regions 1213 and 1215 are formed in mesa 203 by implanting dopants into those regions. For example, where transistor 1201 is an N-channel transistor and transistor 1203 is a P-channel transistor, source/drain regions 1209 and 1211 in layer 107 of mesa 201 would be implanted with N-type dopants (e.g. phosphorous, arsenic) and source/drain regions 1213 and 1215 of layers 107 and 601 of mesa 203 would be implanted with P-type dopants (e.g. Boron).

Spacer 1205 is form on gate stack 1101 and spacer 1207 is formed on gate stack 1103. In one embodiment, the lightly doped extensions of the source/drain regions would be formed prior to the formation of spacers 1205 and 1207 with the heavily doped source/drain regions formed after the spacers. In one embodiment, the spacers as shown would include multiple spacers. Also shown in FIG. 12, silicide structures 1217 and 1219 are formed on source/drain regions 1209 and 1211 respectively, and silicide structures 1225 and 1227 are formed on source/drain regions 1213 and 1215, respectively. Silicide structures 1221 and 1223 are formed on the portions of layer 1001 of mesas 201 and 203, respectively. Silicide structure 1229 is formed on interconnect structure 1105.

In subsequent processes, other structures may be formed on wafer 101 subsequent to the stage shown in FIG. 12. For example, other interlayer dielectrics, conductive interconnect structures, and conductive vias may be formed on wafer 101. External conductive structures (e.g. bond pads) may be formed afterwards. Wafer 101 may be subsequently singulated into different integrated circuits. Each integrated circuit may include multiple transistors as shown in FIG. 12.

Although the gate electrode layer (layer 111) for the N-channel transistor 1201 is formed first in the embodiment shown, in other embodiments, the gate electrode layer for the P-channel transistor may be formed first, wherein that portion of the gate electrode is removed from the N-channel mesa. Also in some embodiments where wafer 101 is a bulk silicon wafer, the trenches used to isolate the mesas would be deeper than the shallow well doping. Also in other embodiments, although layers 111 and 703 are both described as being made of metal materials, one or both of the layers may be made of other types of conductive material (e.g. doped polysilicon).

As set forth above, the above techniques set forth herein may advantageously allow for the separate formation of structures of different types of transistors (e.g. different conductivity type transistors). Accordingly, the structures such as gates, gate dielectrics, and/or portions of the active layer may be separately formed for N-channel and P-channel transistors of an integrated circuit. This may allow for more flexibility in the design and manufacture of an integrated circuit.

In one embodiment, a method of forming a semiconductor device includes forming a first gate dielectric layer over a semiconductor layer, forming a first conductive layer over the first gate dielectric layer, and forming a first separation layer over the first conductive layer. The method also includes after forming the first separation layer, forming a trench in the semiconductor layer that separates a first mesa and a second mesa. The first mesa and the second mesa each include a portion the first gate dielectric layer, a portion of the first conductive layer, a portion of the first separation layer, and a portion of the semiconductor layer. The method also includes filling the trench with an isolation material to a height above a top surface of the first conductive layer, removing the portion of the first conductive layer from the second mesa, and after removing the portion of the first conductive layer from the second mesa, forming a second conductive layer over the portion of the first separation layer of the first mesa and over the second mesa. The method also includes performing planarization to remove the second conductive layer from over the first mesa and forming a first transistor of a first type in the first mesa and a second transistor of a second type in the second mesa.

In another embodiment, a method of forming a semiconductor device includes forming a dielectric layer over a semiconductor layer, forming a first metal layer over the dielectric layer, forming a separation layer over the first metal layer, and forming isolation material separating a first portion of the semiconductor layer, a first portion of the dielectric layer, a first portion of the first metal layer, and a first portion of the separation layer and from a second portion of the semiconductor layer, a second portion the dielectric layer, a second portion the first metal layer, and a second portion the separation layer. The isolation material has height above a top surface of the first metal layer. The method also includes removing the second portion of the first metal layer and after removing the second portion of the first metal layer, forming a second metal layer over the first portion of the separation layer and the second portion of the semiconductor layer. The method still further includes performing planarization to remove the second conductive layer from over the first portion of the separation layer and forming a portion of a first transistor of a first type in the first portion of the semiconductor layer. A gate electrode of the first transistor is includes a portion of the first portion of the first metal layer. The method includes forming a portion of a second transistor of a second type in the second portion of the semiconductor layer. A gate electrode of the second transistor includes a portion of the second metal layer.

In one embodiment, a method of making a semiconductor device structure includes forming a first stack and a second stack separated by an isolation region. The first stack comprises a first portion of a first semiconductor layer, a first portion of a first gate dielectric layer over the first portion of the first semiconductor layer, a first portion of a first metal layer over the first portion of the first gate dielectric layer, and a first portion of a separation layer over the first portion of the first metal layer. The second stack comprises a second portion of the first semiconductor layer, a second portion of the first gate dielectric layer over the second portion of the first semiconductor layer, a second portion of the first metal layer over the second portion of the first gate dielectric layer, and a second portion of the separation layer over the second portion of the first metal layer. The isolation region has a height above a top surface of the first metal layer. The method also includes removing the second portion of the first metal layer and depositing a second metal layer whereby a first portion of the second metal layer is over the first portion of the separation layer and a second portion of the second metal layer is over the second portion of the semiconductor layer. The method also includes removing the first portion of the second metal layer while leaving the second portion of the second metal layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a semiconductor device, comprising:
   forming a first gate dielectric layer over a semiconductor layer;
   forming a first conductive layer over the first gate dielectric layer;
   forming a first separation layer over the first conductive layer;
   after forming the first separation layer, forming a trench in the semiconductor layer that separates a first mesa and a second mesa, wherein the first mesa and the second mesa each include a portion the first gate dielectric layer, a portion of the first conductive layer, a portion of the first separation layer, and a portion of the semiconductor layer;
   filling the trench with an isolation material to a height above a top surface of the first conductive layer such that no part of the trench below the height is unfilled as a result of the filling;
   removing the portion of the first conductive layer from the second mesa;
   after removing the portion of the first conductive layer from the second mesa, forming a second conductive layer over the portion of the first separation layer of the first mesa and over the second mesa;

performing planarization to remove the second conductive layer from over the first mesa; and forming a first transistor of a first type in the first mesa and a second transistor of a second type in the second mesa.

2. The method of claim 1, wherein the step of forming the first conductive layer is further characterized by the first conductive layer comprising metal.

3. The method of claim 1, wherein the step of forming the second conductive layer is further characterized by the second conductive layer comprising metal.

4. The method of claim 1 further comprising:
forming a first sidewall spacer around the first mesa; and
forming a second sidewall spacer around the second mesa.

5. The method of claim 1 further comprising forming a second gate dielectric layer on the portion of the first gate dielectric layer of the second mesa after the step of removing the portion of the first conductive layer from the second mesa.

6. The method of claim 1, further comprising:
removing the portion of the first gate dielectric layer from the second mesa; and
forming a second gate dielectric layer on the second mesa after the step of removing the portion of the first gate dielectric layer from the second mesa.

7. The method of claim 1, wherein the step of forming the first gate dielectric layer is further characterized by the first gate dielectric layer comprising metal and oxygen.

8. The method of claim 1, wherein the step of forming the first separation layer is further characterized by the first separation layer comprising nitride.

9. The method of claim 1 further comprising performing chemical mechanical polishing after the step of filling the trench and before the step of removing the portion of the first conductive layer from the second mesa.

10. The method of claim 3, wherein the step of forming the first conductive layer is further characterized by the first conductive layer comprising metal of a different type from the metal of the second conductive layer.

11. The method of claim 1, further comprising:
removing the portion of the gate dielectric layer from the second mesa prior to the step of forming the second conductive layer; and
epitaxially growing a second semiconductor layer on the second mesa after the step of removing the portion of the gate dielectric layer from the second mesa and prior to the step of forming the second conductive layer.

12. The method of claim 1, further comprising performing an anneal after the step of removing the portion of the first conductive layer from the second mesa and prior to forming the second conductive layer.

13. The method of claim 1, further comprising selectively doping the semiconductor layer so that the portion of the semiconductor layer of the first mesa has a different conductivity type from the portion of the semiconductor layer of the second mesa.

14. A method of forming a semiconductor device, comprising:
forming a first gate dielectric layer over a semiconductor layer;
forming a first conductive layer over the first gate dielectric layer;
forming a first separation layer over the first conductive layer;
after forming the first separation layer, forming a trench in the semiconductor layer that separates a first mesa and a second mesa, wherein the first mesa and the second mesa each include a portion the first gate dielectric layer, a portion of the first conductive layer, a portion of the first separation layer, and a portion of the semiconductor layer;
filling the trench with an isolation material to a height above a top surface of the first conductive layer such that no part of the trench below the height is unfilled as a result of the filling;
removing the portion of the first conductive layer from the second mesa;
after removing the portion of the first conductive layer from the second mesa, forming a second conductive layer over the portion of the first separation layer of the first mesa and over the second mesa;
performing planarization to remove the second conductive layer from over the first mesa; and
forming a first transistor of a first type in the first mesa and a second transistor of a second type in the second mesa;
wherein the step of forming the second conductive layer is further characterized by the second conductive layer comprising metal;
wherein the step of forming the first conductive layer is further characterized by the first conductive layer comprising metal of a different type from the metal of the second conductive layer.

15. A method of forming a semiconductor device, comprising:
forming a first gate dielectric layer over a semiconductor layer;
forming a first conductive layer over the first gate dielectric layer;
forming a first separation layer over the first conductive layer;
after forming the first separation layer, forming a trench in the semiconductor layer that separates a first mesa and a second mesa, wherein the first mesa and the second mesa each include a portion the first gate dielectric layer, a portion of the first conductive layer, a portion of the first separation layer, and a portion of the semiconductor layer;
filling the trench with an isolation material to a height above a top surface of the first conductive layer such that no part of the trench below the height is unfilled as a result of the filling;
removing the portion of the first conductive layer from the second mesa;
after removing the portion of the first conductive layer from the second mesa, forming a second conductive layer over the portion of the first separation layer of the first mesa and over the second mesa;
performing planarization to remove the second conductive layer from over the first mesa; and
forming a first transistor of a first type in the first mesa and a second transistor of a second type in the second mesa;
removing the portion of the gate dielectric layer from the second mesa prior to the step of forming the second conductive layer; and
epitaxially growing a second semiconductor layer on the second mesa after the step of removing the portion of the gate dielectric layer from the second mesa and prior to the step of forming the second conductive layer.

16. A method of forming a semiconductor device, comprising:
forming a first gate dielectric layer over a semiconductor layer;
forming a first conductive layer over the first gate dielectric layer;

forming a first separation layer over the first conductive layer;

after forming the first separation layer, forming a trench in the semiconductor layer that separates a first mesa and a second mesa, wherein the first mesa and the second mesa each include a portion the first gate dielectric layer, a portion of the first conductive layer, a portion of the first separation layer, and a portion of the semiconductor layer;

filling the trench with an isolation material to a height above a top surface of the first conductive layer such that no part of the trench below the height is unfilled as a result of the filling;

removing the portion of the first conductive layer from the second mesa;

after removing the portion of the first conductive layer from the second mesa, forming a second conductive layer over the portion of the first separation layer of the first mesa and over the second mesa;

performing planarization to remove the second conductive layer from over the first mesa; and forming a first transistor of a first type in the first mesa and a second transistor of a second type in the second mesa;

performing an anneal after the step of removing the portion of the first conductive layer from the second mesa and prior to forming the second conductive layer.

17. A method of forming a semiconductor device, comprising:

forming a first gate dielectric layer over a semiconductor layer;

forming a first conductive layer over the first gate dielectric layer;

forming a first separation layer over the first conductive layer;

after forming the first separation layer, forming a trench in the semiconductor layer that separates a first mesa and a second mesa, wherein the first mesa and the second mesa each include a portion the first gate dielectric layer, a portion of the first conductive layer, a portion of the first separation layer, and a portion of the semiconductor layer;

filling the trench with an isolation material to a height above a top surface of the first conductive layer such that no part of the trench below the height is unfilled as a result of the filling;

removing the portion of the first conductive layer from the second mesa;

after removing the portion of the first conductive layer from the second mesa, forming a second conductive layer over the portion of the first separation layer of the first mesa and over the second mesa;

performing planarization to remove the second conductive layer from over the first mesa; and forming a first transistor of a first type in the first mesa and a second transistor of a second type in the second mesa;

selectively doping the semiconductor layer so that the portion of the semiconductor layer of the first mesa has a different conductivity type from the portion of the semiconductor layer of the second mesa.

18. A method of forming a semiconductor device, comprising:

forming a dielectric layer over a semiconductor layer;

forming a first metal layer over the dielectric layer;

forming a separation layer over the first metal layer;

forming isolation material separating a first portion of the semiconductor layer, a first portion of the dielectric layer, a first portion of the first metal layer, and a first portion of the separation layer and from a second portion of the semiconductor layer, a second portion the dielectric layer, a second portion the first metal layer, and a second portion the separation layer, wherein the isolation material has height above a top surface of the first metal layer;

removing the second portion of the first metal layer;

after removing the second portion of the first metal layer, forming a second metal layer over the first portion of the separation layer and the second portion of the semiconductor layer;

performing planarization to remove the second metal layer from over the first portion of the separation layer; and forming a portion of a first transistor of a first type in the first portion of the semiconductor layer wherein a gate electrode of the first transistor includes a portion of the first portion of the first metal layer, and forming a portion of a second transistor of a second type in the second portion of the semiconductor layer wherein a gate electrode of the second transistor includes a portion of the second metal layer.

19. The method of claim 18 wherein the step of forming the second metal layer is further characterized by the second metal layer being a different type of metal than that of the first metal layer.

20. The method of claim 18 further comprising:

removing the second portion of the dielectric layer; and forming a gate dielectric over the second portion of the semiconductor layer after the step of removing the second portion of the dielectric layer.

21. The method of claim 20, further comprising growing a second semiconductor layer on the second portion of the semiconductor layer after the step of removing the second portion of the dielectric layer.

22. A method of making a semiconductor device structure, comprising:

forming a first stack and a second stack separated by an isolation region, wherein:

the first stack comprises a first portion of a first semiconductor layer, a first portion of a first gate dielectric layer over the first portion of the first semiconductor layer, a first portion of a first metal layer over the first portion of the first gate dielectric layer, and a first portion of a separation layer over the first portion of the first metal layer;

the second stack comprises a second portion of the first semiconductor layer, a second portion of the first gate dielectric layer over the second portion of the first semiconductor layer, a second portion of the first metal layer over the second portion of the first gate dielectric layer, and a second portion of the separation layer over the second portion of the first metal layer; and the isolation region has a height above a top surface of the first metal layer;

removing the second portion of the first metal layer;

depositing a second metal layer whereby a first portion of the second metal layer is over the first portion of the separation layer and a second portion of the second metal layer is over the second portion of the semiconductor layer; and removing the first portion of the second metal layer while leaving the second portion of the second metal layer.

23. The method of claim 22, further comprising forming a first transistor and a second transistor, wherein:

the first transistor includes a current terminal region formed in the first portion of the semiconductor layer and a gate electrode formed from the first portion of the first metal layer; and the second transistor includes a current terminal region formed in the second portion of the semiconductor layer and a gate electrode formed from the second portion of the second metal layer.

24. The method of claim 23 further comprising:

forming a second semiconductor layer over the second portion of the semiconductor layer after the removing the second portion of the first metal layer and prior to the depositing the second metal layer;

wherein the current terminal region of the second transistor is also formed in the second semiconductor layer.

25. The method of claim 22 wherein the step of removing the first portion of the second metal layer is further characterized as comprising chemical mechanical polishing.

* * * * *